US008633522B2

(12) United States Patent
Zhu et al.

(10) Patent No.: US 8,633,522 B2
(45) Date of Patent: Jan. 21, 2014

(54) SEMICONDUCTOR STRUCTURE AND METHOD FOR FABRICATING THE SAME

(75) Inventors: Huilong Zhu, Poughkeepsie, NY (US);
Haizhou Yin, Poughkeepsie, NY (US);
Zhijiong Luo, Poughkeepsie, NY (US);
Huicai Zhong, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 6 days.

(21) Appl. No.: 13/062,733

(22) PCT Filed: Sep. 20, 2010

(86) PCT No.: PCT/CN2010/001446
§ 371 (c)(1),
(2), (4) Date: Mar. 8, 2011

(87) PCT Pub. No.: WO2012/027864
PCT Pub. Date: Mar. 8, 2012

(65) Prior Publication Data
US 2012/0049249 A1    Mar. 1, 2012

(30) Foreign Application Priority Data
Aug. 31, 2010    (CN) .......................... 2010 1 0269260

(51) Int. Cl.
*H01L 29/78* (2006.01)
(52) U.S. Cl.
USPC ........................................................ 257/288
(58) Field of Classification Search
USPC ................................ 257/288, 355; 438/151, 197
See application file for complete search history.

(56) References Cited

U.S. PATENT DOCUMENTS

| | | | | |
|---|---|---|---|---|
| 2009/0032845 A1* | 2/2009 | Zhu et al. | ...................... | 257/192 |
| 2009/0090979 A1* | 4/2009 | Zhu et al. | ...................... | 257/408 |
| 2009/0236676 A1* | 9/2009 | Zhu et al. | ...................... | 257/413 |
| 2010/0035400 A1* | 2/2010 | Zhu et al. | ...................... | 438/300 |
| 2010/0059764 A1* | 3/2010 | Luo et al. | ........................ | 257/77 |

FOREIGN PATENT DOCUMENTS

| | | |
|---|---|---|
| CN | 101410959 A | 4/2009 |
| CN | 101490842 A | 7/2009 |
| CN | 101777565 A | 7/2010 |

OTHER PUBLICATIONS

A First Office Action issued Nov. 26, 2012, by the China Patent Office in related Chinese Patent Application No. CN201010269260.0, with English translation (6 pages).

* cited by examiner

*Primary Examiner* — Nathan Ha
(74) *Attorney, Agent, or Firm* — Osha Liang LLP

(57) ABSTRACT

A semiconductor structure and a method for fabricating the same. A semiconductor structure includes a semiconductor substrate; a channel region formed in the semiconductor substrate; a gate including a dielectric layer and a conductive layer and formed above the channel region; source and drain regions formed at opposing sides of the gate; first shallow trench isolations embedded into the semiconductor substrate and having a length direction parallel to the length direction of the gate; and second shallow trench isolations, each of which abuts the outer sidewall of the source or the drain region and abuts the first shallow trench isolations, in which the source and drain regions include first seed crystal layers abutting the second shallow trench isolations, and the top surfaces of the second shallow trench isolations are higher than or as high as the top surfaces of the source and drain regions.

19 Claims, 11 Drawing Sheets

SEMICONDUCTOR STRUCTURE AND METHOD FOR FABRICATING THE SAME

FIELD OF INVENTION

The present invention generally relates to the field of semiconductor, and more particularly, to a semiconductor structure with self-aligned source and drain regions and capable of effectively enhancing the stress in the channel region and a method for fabricating the same.

BACKGROUND

With increasingly scaling of features of Metal Oxide Semiconductor Field Effect Transistor (MOSFET) devices, it is necessary to increase doping concentrations in the channel and reduce the thickness of gate dielectric layer in order to suppress the short channel effects, prevent the source-drain punch through and increase the drive current. However, at the same time, the high carrier concentration and the strong longitudinal electrical field also cause the carrier mobility in the channel to decrease with the scaling of the features, which results in reduction of saturation drive current and a decreased cutoff frequency.

The strained channel technology is an effective way to enhance the mobility of carriers and thus can further improve the electrical performances of the devices. However, isolations among MOSFETs are generally achieved by Shallow Trench Isolations (STIs). After the STIs have been formed, the MOSFETs are formed by a series of processes such as aggressive cleaning and reactive ion etching, which causes STIs' surface reduction. As a result, the stress in the channel of the MOSFETs will decrease due to the STIs' surface reduction, and thus the performance improvement with conventional strained channel engineering is weakened.

In view of the above, there is a need for a novel semiconductor structure and a method for fabricating the same, to further enhance the channel stress and reduce the device size.

SUMMARY OF THE INVENTION

It is an object of the present invention to provide a semiconductor structure and a method for fabricating the same to overcome the problems in the prior art, especially, to further enhance the channel stress in MOSFETs.

According to an aspect of the present invention, there is provided a semiconductor structure, comprising: a semiconductor substrate; a channel region formed in the semiconductor substrate; a gate, which includes a dielectric layer and a conductive layer and is formed above the channel region; source and drain regions, which are formed at opposing sides of the gate; first shallow trench isolations, which are embedded into the semiconductor substrate and have a length direction parallel to the length direction of the gate; and second shallow trench isolations, which are formed at sidewalls of the source and drain regions and abutting the first shallow trench isolations, wherein the source and drain regions comprise first seed crystal layers disposed at opposite sides of the gate and abutting the second shallow trench isolations, and the top surfaces of the second shallow trench isolations are higher than or as high as the top surfaces of the source and drain regions.

Preferably, the source and drain regions are self-aligned to the gate.

Preferably, the second shallow trench isolations are isolated from the source and drain regions by a dielectric material above the first seed crystal layers. Preferably, the dielectric material comprises $Si_3N_4$.

Preferably, the source and drain regions comprise stressors applying a stress to the channel region. For a p-type Metal Oxide Semiconductor Field Effect Transistor (pMOSFET), the stressors apply a compressive stress to the channel region; and for a n-type Metal Oxide Semiconductor Field Effect Transistor (nMOSFET), the stressors apply a tensile stress to the channel region.

Preferably, for a pMOSFET, the stressors comprise $Si_{1-x}Ge_x$, where $0<x<1$; and for a nMOSFET, the stressor comprise Si:C.

Preferably, in the $Si_{1-x}Ge_x$ material, an atomic percentage of Ge is in a range of 15%-70%; and in the Si:C material, an atomic percentage of C is in a range of 0.2%-2%.

Preferably, the filled dielectric of the second shallow trench isolations comprises $Si_3N_4$.

According to another aspect of the present invention, there is provided a method for fabricating a semiconductor structure, comprising: providing a semiconductor substrate; forming first shallow trench isolations and second shallow trench isolations; forming a gate including a dielectric layer and a conductive layer and having a gate length direction parallel to the length direction of the first shallow trench isolations; and forming source and drain regions at opposing sides of the gate, the source and drain regions comprising first seed crystal layers disposed at lateral sides of the gate and abutting the second shallow trench isolations, wherein the second shallow trench isolations are formed at sidewalls of the source and drain regions and abutting the first shallow trench isolations, and the top surfaces of the second shallow trench isolations are higher than or as high as the top surfaces of the source and drain regions.

Preferably, the step of forming the source and drain regions comprises: etching the gate dielectric layer and the semiconductor substrate downward within boundaries defined by a spacer for the gate and spacers for the second shallow trench isolations, so as to form source and drain grooves; and epitaxially growing stressors by using the first seed crystal layers, the bottoms of the source and drain grooves as second seed crystal layers, and the portions of the source and drain grooves adjacent to the gate as third seed crystal layers.

Preferably, before forming the source and drain grooves and after forming the gate, the method further comprises forming extension regions and HALO regions for the source and drain regions.

Preferably, for a p-type Metal Oxide Semiconductor Field Effect Transistor (pMOSFET), any one or more from B, $BF_2$, and In are implanted to form the extension regions for the source and drain regions; and for a n-type Metal Oxide Semiconductor Field Effect Transistor (nMOSFET), any one or more from As and P are implanted to form the extension regions for the source and drain regions.

Preferably, for a pMOSFET, any one or more from As and P are implanted to form the HALO regions for the source and drain regions; and for a nMOSFET, any one or more from B, $BF_2$, and In are implanted to form the HALO regions for the source and drain regions.

Preferably, for a pMOSFET, the stressors apply a compressive stress to the channel region; and for a nMOSFET, the stressors apply a tensile stress to the channel region.

Preferably, for a pMOSFET, the stressors comprise $Si_{1-x}Ge_x$ to create the compressive stress, where $0<x<1$; and for a nMOSFET, the stressor comprise Si:C to create the tensile stress.

Preferably, in the $Si_{1-x}Ge_x$ material, an atomic percentage of Ge is in a range of 15%-70%; and in the Si:C material, an atomic percentage of C is in a range of 0.2% -2%.

Preferably, the source and drain regions are doped in situ whiling epitaxially growing the stressors.

Preferably, for a pMOSFET, B is doped in situ while epitaxially growing $Si_{1-x}Ge_x$; and for a nMOSFET, P is doped in situ while epitaxially growing Si:C.

Preferably, the filled dielectric of the second shallow trench isolations comprise $Si_3N_4$.

The present invention has the following advantages as compared with the prior art.

According to embodiments of the present invention, the top surfaces of the formed second shallow trench isolations are higher than or as high as those of the source and drain regions. Thus, it is possible to prevent the stress from being released from the lateral boundaries, so as to enhance channel stress and thus to increase carrier mobility.

Further, according to embodiments of the present invention, the source and drain regions can be formed in a way of self-aligning to the gate. Thus, it is possible to avoid misalignment and thus to improve the device performance. Also, it is possible to save area of the device and thus to reduce the manufacture cost.

Furthermore, stressors may be formed in the source and drain regions. The stressed material may be formed by epitaxy to apply a stress to the channel region, for example, for a pMOSFET, the source and drain regions producing a compressive stress and for an nMOSFET, the source and drain regions producing a tensile stress. The carrier mobility in the channel region may be further enhanced by adjusting the stress in the channel region of the device.

In addition, according to embodiments of the present invention, there are first seed crystal layers reserved at the sidewalls of the source and drain grooves close to the second shallow trench isolations. Therefore, the stressors, for example, $Si_{1-x}Ge_x$, may be epitaxially grown by using the sidewalls of the source and drain grooves close to the second shallow trench isolations as the first seed crystal layers, using the bottoms of the source and drain grooves as second seed crystal layers, and using the portions of the source and drain grooves adjacent to the gate as third seed crystal layers. Thus, it is possible to improve crystal quality and form a single crystal of high quality in the source and drain regions, and thus parasitic resistances in the source and drain regions are reduced.

Moreover, the material of the shallow trench isolations preferably comprises nitride to reduce the loss of the material in the subsequent processes.

Further, it is possible to further suppress the short channel effects by forming extension and HALO regions for the source and drain regions.

BRIEF DESCRIPTION OF THE DRAWINGS

In the following, section views shown in FIGS. 6-21 are those taken along a section line (1-1') of corresponding top views.

DETAILED DESCRIPTION OF PREFERRED EMBODIMENTS

Hereinafter, embodiments of the present invention are described in detail, and examples thereof are illustrated in the attached drawings, throughout which same or like reference numbers refer to same or like elements or elements having same or like functions. In the following, the embodiments described with reference to the drawings are just illustrative and are intended to elaborate the present invention, and cannot be interpreted as limiting the present invention.

The following descriptions provide various embodiments or examples to implement the technical solutions of the present invention. Although components and arrangements for particular examples are described in the following, they are just exemplary and are not intended to limit the invention.

Further, here, examples of particular processes and/or materials are provided, and it is apparent that substitutions of other processes and/or other materials, of which those skilled in the art can be aware, do not depart from the scope of the present invention. It is to be noted that the relative relationships between respective structures in the description comprise necessary extensions required by the processes or manufacture flows. For example, the term of "being as high as" means that the two surfaces can have a height difference within a range allowed in the processes or manufacture flows.

FIGS. 1-21 show details of the steps for fabricating a semiconductor structure according to an embodiment of the present invention. Hereinafter, the respective steps as well as the resulting semiconductor structure are described in detail with reference to those drawings.

Figure 1:
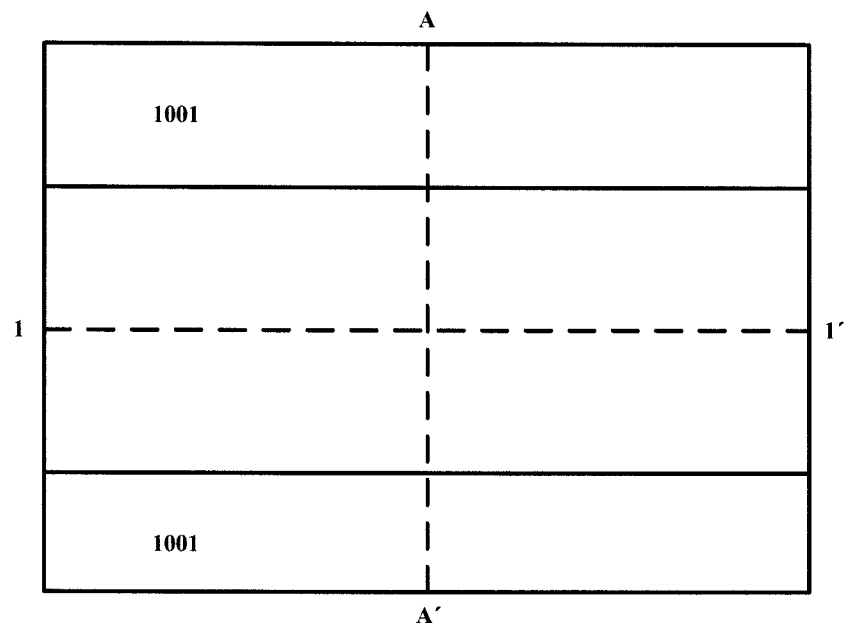
FIGS. 1, 2 and 3, respectively, are a top view, a section view along a section line (A-A') and a further section view along a further section line (1-1') showing a step of forming first shallow trench isolations in a semiconductor substrate according to an embodiment of a method for fabricating a semiconductor structure of the present invention.
Figure 2:
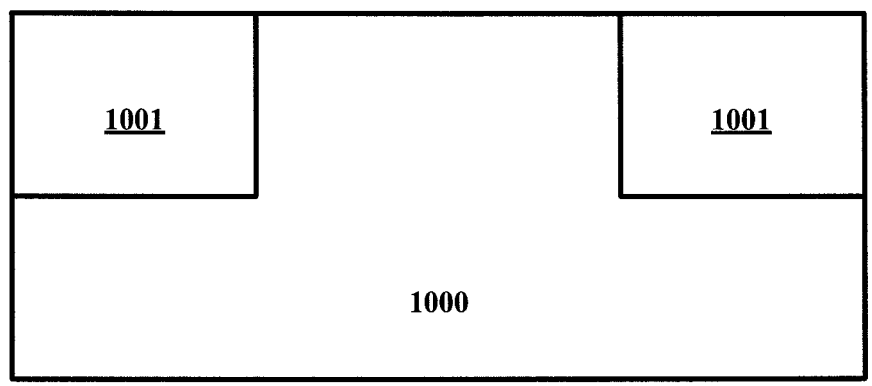
Figure 3:
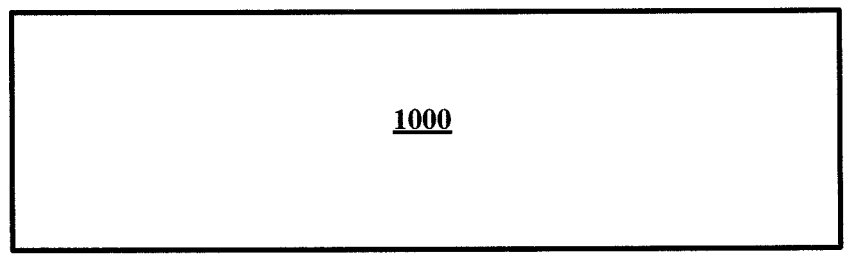

Firstly, as shown in FIG. 1, a semiconductor substrate 1000 is provided, and first shallow trench isolations 1001 are formed in the semiconductor substrate with a conventional method. FIGS. 2 and 3 show the section views of the semiconductor substrate 1000 with the first shallow trench isolations 1001 formed therein along line A-A' and line 1-1', respectively. The substrate 1000 may comprise bulk silicon or Silicon On Insulator (SOI), or other suitable semiconductor materials, e.g. III-V group compound semiconductor materials such as GaAs.

Figure 4:
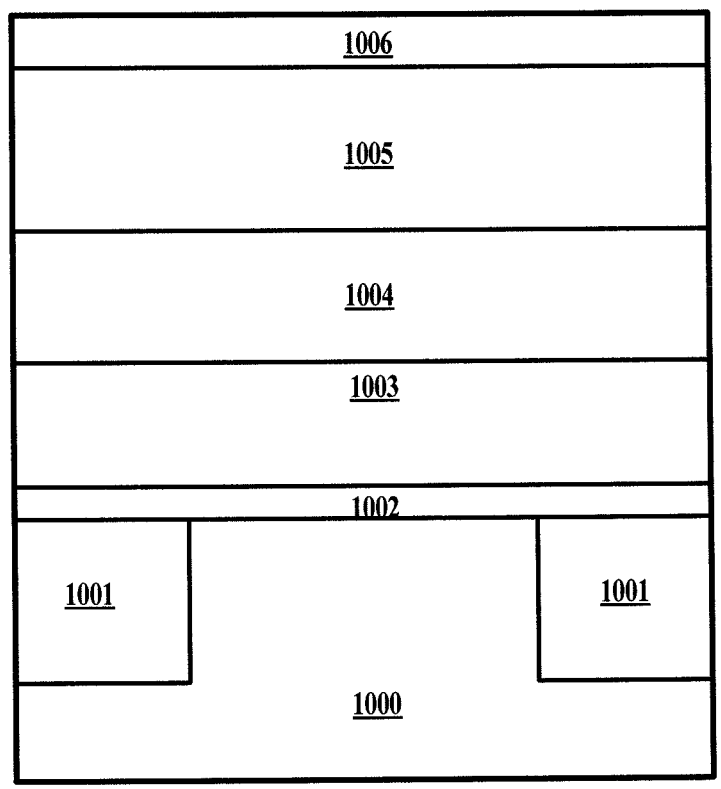
FIGS. 4 and 5, respectively, are a section view along a section line (A-A') and a further section view along a further section line (1-1') showing a step of forming respective material layers required for forming a semiconductor device on the semiconductor substrate according to an embodiment of the method for fabricating a semiconductor structure of the present invention.
Figure 5:
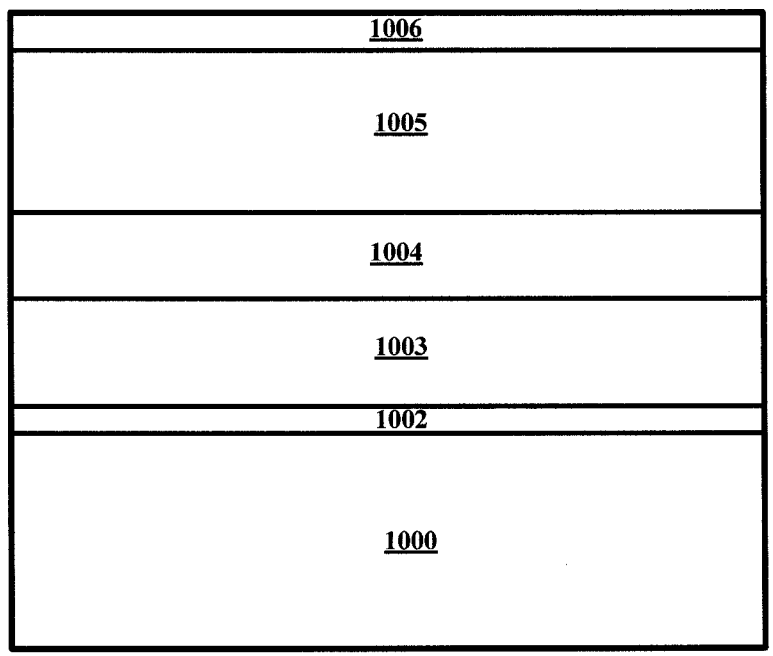

Subsequently, as shown in the section views along line A-A' and line 1-1' in FIGS. 4 and 5, respectively, on the semiconductor substrate 1001, a gate dielectric layer 1002, a conductive layer 1003 (for example, a metal and/or poly-silicon layer; and in this embodiment of the present invention, it is a first poly-silicon layer), a nitride layer 1004, a second poly-silicon layer 1005, and an oxide layer 1006 are formed in this order. These layers may be formed, for example, by conventional deposition processes.

The material of gate dielectric layer 1002 may comprise any one or more selected from $HfO_2$, HfSiO, HfSiON, HfTaO, HfTiO, HfZrO, $Al_2O_3$, $La_2O_3$, $ZrO_2$, and LaAlO.

The gate dielectric layer 1002 may have a thickness of 1-3 nm, for example, 2 nm. The first poly-silicon layer (the conductive layer) 1003 may have a thickness of 50-100 nm, for example, 60 nm, 70 nm, 80 nm or 90 nm. The nitride layer 1004 may have a thickness of 50-70 nm, for example, 55 nm, 60 nm or 65 nm. The second poly-silicon layer 1005 may have a thickness of 100-150 nm, for example, 110 nm, 120 nm, 130 nm or 140 nm. The oxide layer 1006 may have a thickness of 10-20 nm, for example, 15 nm.

Figure 6:
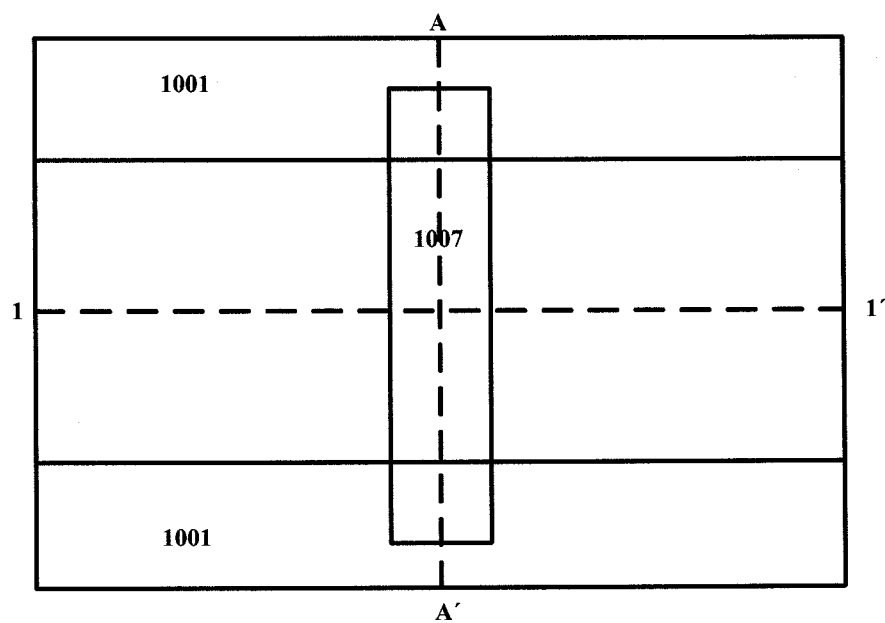
FIGS. 6 and 7, respectively, are a top view and a section view showing a step of patterning a gate according to an embodiment of the method for fabricating a semiconductor structure of the present invention.
Figure 7:
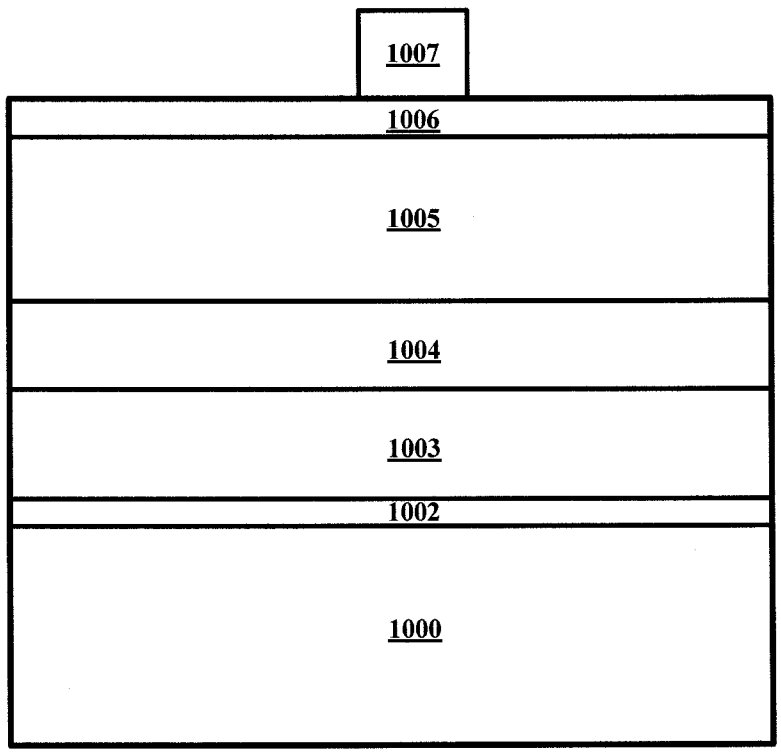
Figure 8:
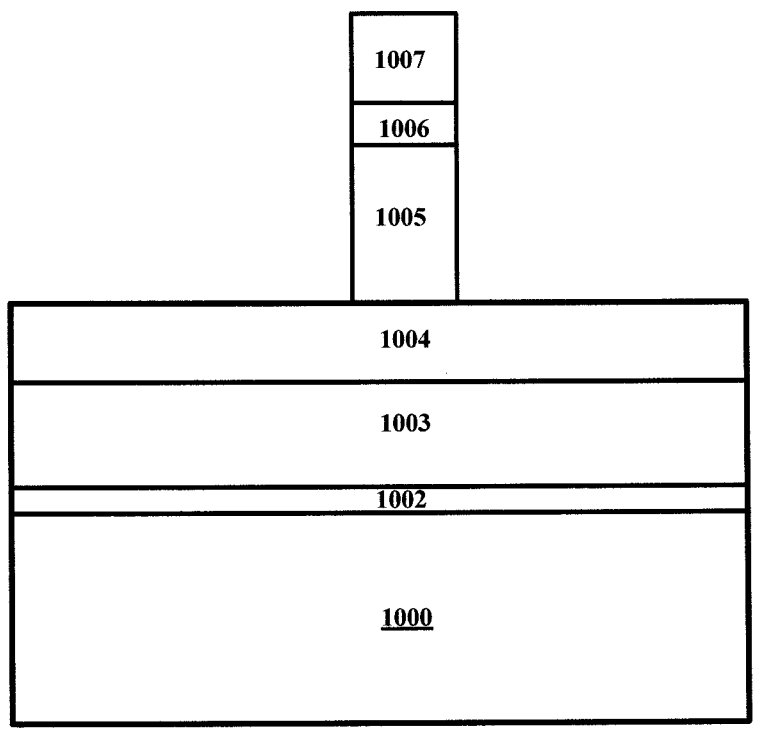
FIG. 8 is a section view showing a step of etching an oxide layer and a poly-silicon layer according to an embodiment of the method for fabricating a semiconductor structure of the present invention.

Then, a gate is formed by patterning. Specifically, a photo resist 1007 is spin-coated on the oxide layer 1006, prebaked at a certain temperature, exposed through a mask having a pattern required for the formation of gate, and then developed. After a further high temperature treatment, a photo resist pattern is formed on the oxide layer, as shown in FIG. 6. FIG. 7 shows a section view of the structure in FIG. 6 along the 1-1' line. Subsequently, the oxide layer 1006 and the second poly-silicon layer 1005 are etched by using the photo resist 1007 as a mask, resulting in a structure shown in FIG. 8. In this embodiment, a Reactive Ion Etching (RIE) may be adopted, and the types and flows of the etching gases can be appropriately adjusted based on the kinds of materials to be etched and the device structures to be formed.

Figure 9:
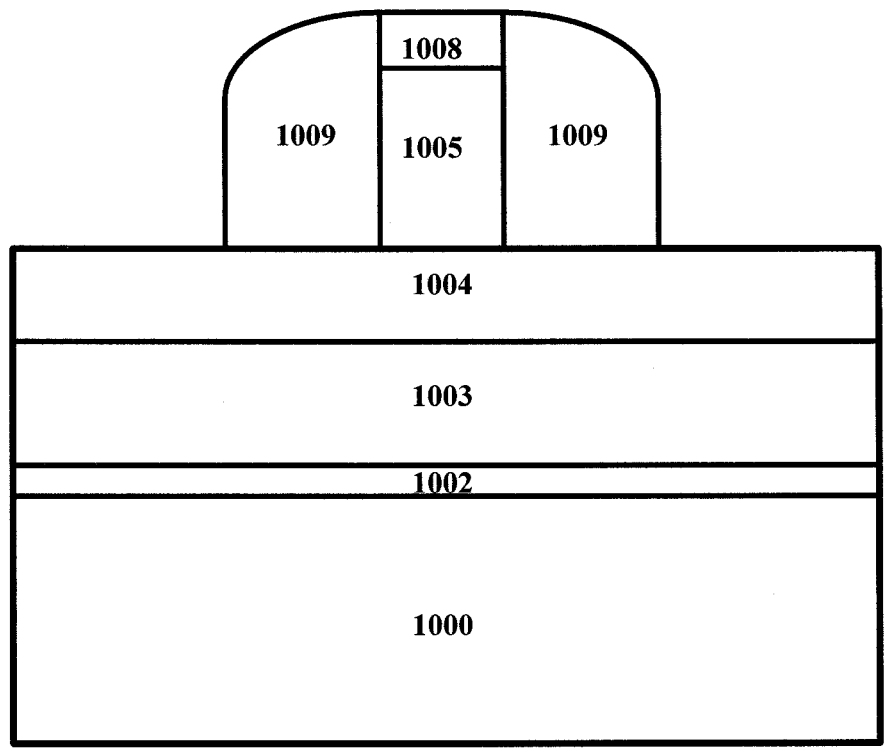
FIG. 9 is a section view showing a step of forming an oxide cap layer and a spacer according to an embodiment of the method for fabricating a semiconductor structure of the present invention.
Figure 10:
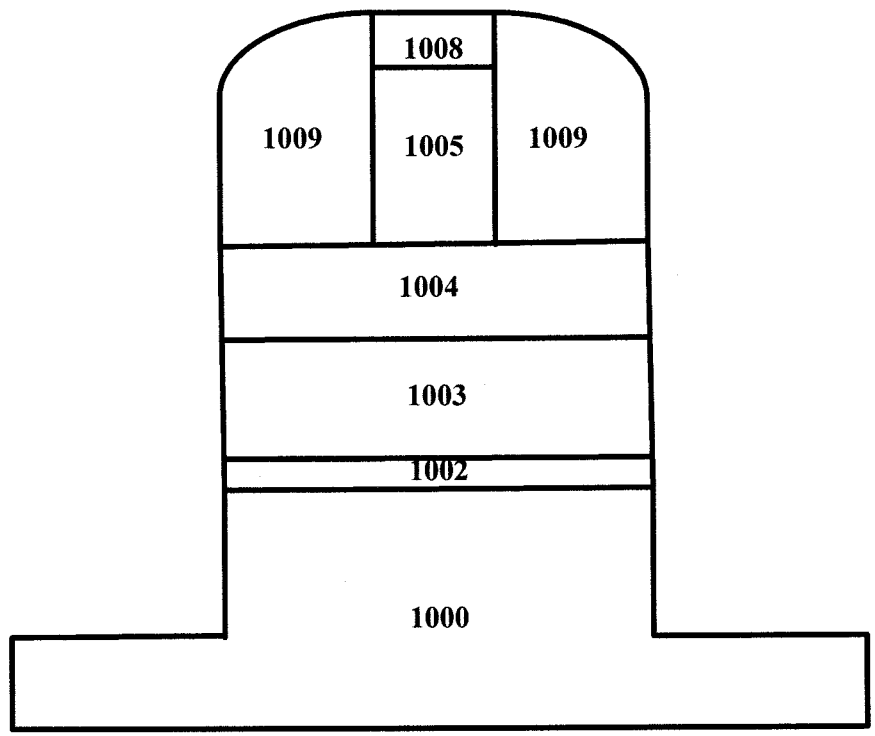
FIG. 10 is a section view showing a step of forming trenches for second shallow trench isolations according to an embodiment of the method for fabricating a semiconductor structure of the present invention.

Then, the photo resist 1007 is removed and an oxide layer is deposited in a conventional way in the related art. The oxide layer may have a thickness of 40-100 nm, for example, 50 nm, 60 nm, 70 nm, 80 nm or 90 nm. The oxide layer is etched to form an oxide cap layer 1008 covering the top of the second poly-silicon layer 1005 and a spacer 1009, as shown in FIG. 9. In this embodiment, a Reactive Ion Etching may be adopted. Next, as shown in FIG. 10, the nitride layer 1004, the first poly-silicon layer 1003, the gate dielectric layer 1002, and a portion of the semiconductor substrate 1000 are selectively etched with respect to the oxide, so as to form trenches for second shallow trench isolations. In this embodiment, a Reactive Ion Etching may be adopted.

Figure 11:
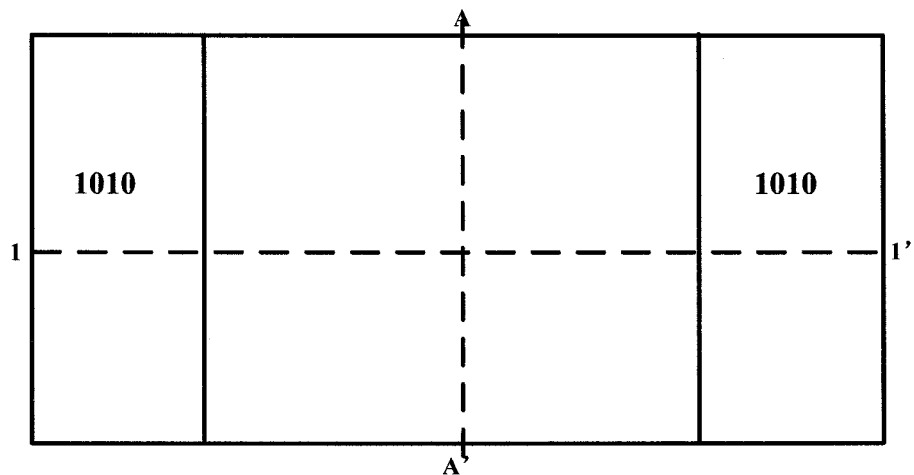
FIGS. 11 and 12, respectively, are a top view and a section view showing a step of forming the second shallow trench isolations according to an embodiment of the method for fabricating a semiconductor structure of the present invention.
Figure 12:
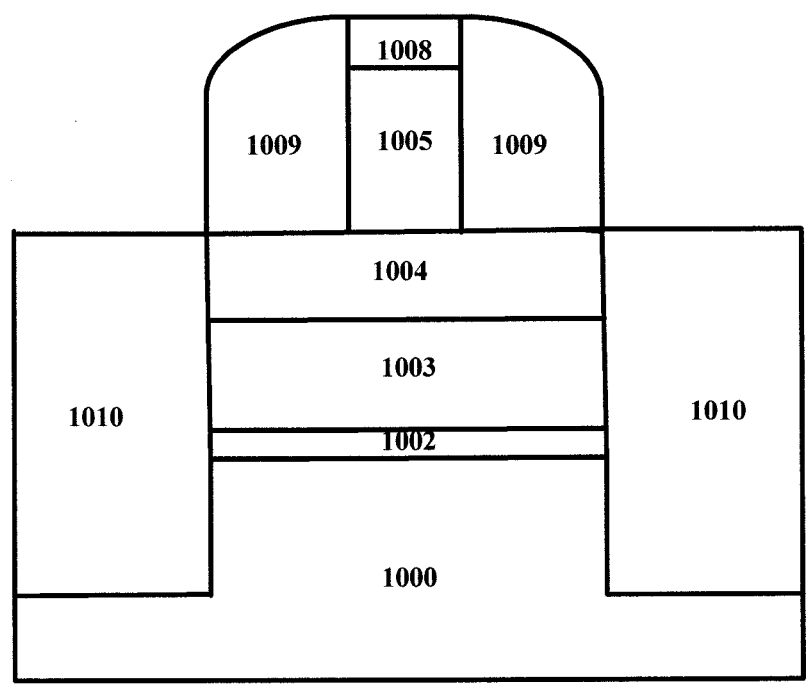

As shown in the top view in FIG. 11 and the section view in FIG. 12 along the 1-1' line of FIG. 11, a nitride, for example, $Si_3N_4$, is deposited and etched back to form the second shallow trench isolations 1010.

Figure 13:
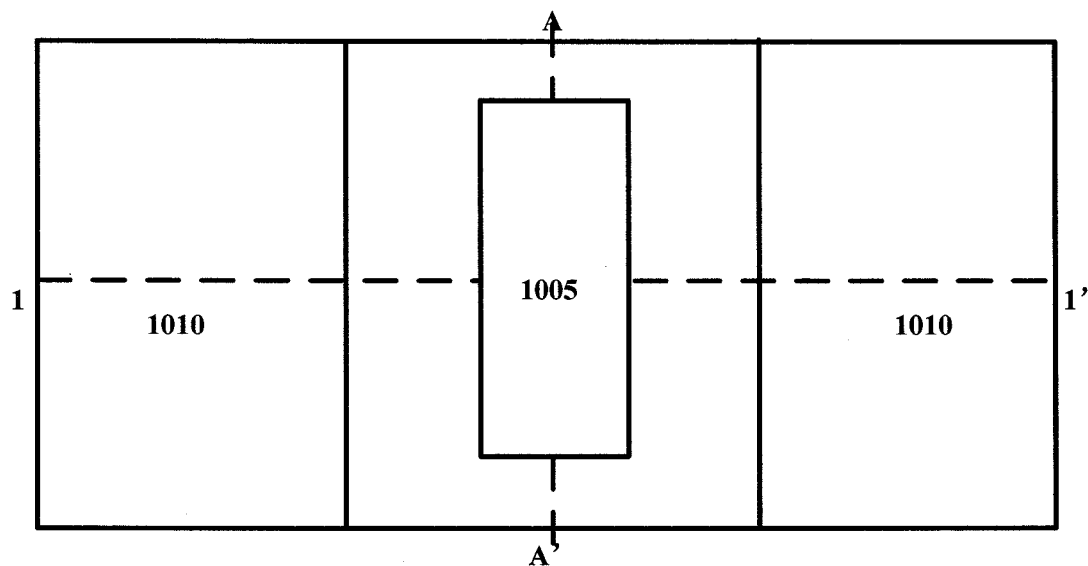
FIGS. 13 and 14, respectively, are a top view and a section view showing a step of removing the oxide cap layer and the spacer according to an embodiment of the method for fabricating a semiconductor structure of the present invention.
Figure 14:
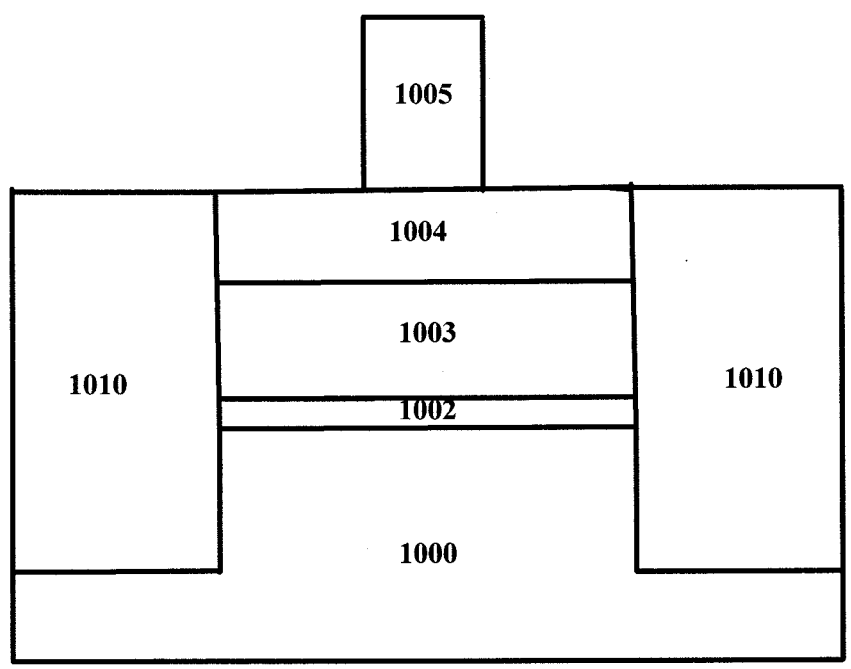
Figure 15:
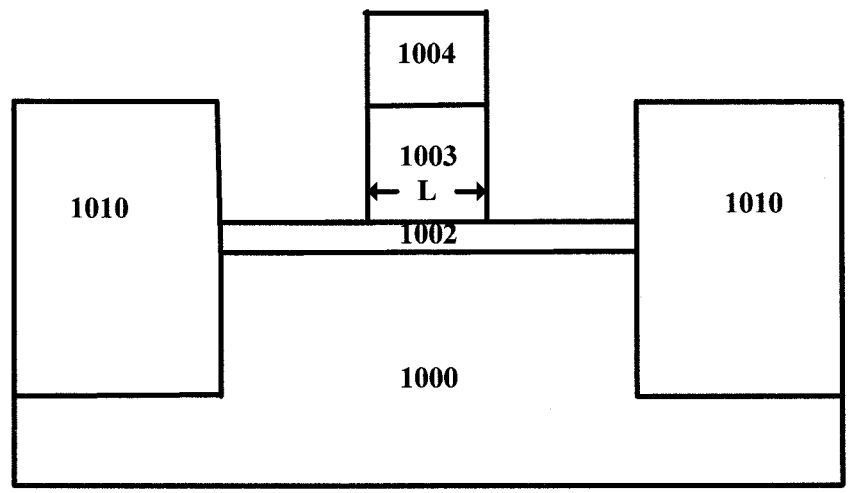
FIG. 15 is a section view showing a step of forming the gate according to an embodiment of the method for fabricating a semiconductor structure of the present invention.

Then, the oxide isolation medium, namely, the oxide cap layer 1008 on the top of the second poly-silicon layer 1005 and the spacer 1009, is selectively removed with respect to the poly-silicon and the nitride, as shown in the top view in FIG. 13 and section view in FIG. 14 along the 1-1' line of FIG. 13.

Next, the nitride 1004 is etched by a Reactive Ion Etching process. And then, with respect to the gate dielectric, the first poly-silicon layer 1003 and the second poly-silicon layer 1005 are selective etched by RIE, resulting in the structure shown in FIG. 15. In the whole application document, the term "gate length" refers to the length direction shown by "L" in FIG. 15.

Preferably, HALO and extension structures (not shown) for source and drain regions may be formed by ion implantations to suppress short channel effects. To form extension regions for source and drain regions, an ion implantation of As or P may be conducted for an n-type MOSFET (nMOSFET), and an ion implantation of B, $BF_2$ or In may be conducted for a p-type MOSFET (pMOSFET). To form HALO regions for source and drain regions, $BF_2$ or In may be conducted for an nMOSFET, an ion implantation of B, and an ion implantation of As or P may be conducted for a pMOSFET. Then, a spike anneal at 900-1100° C. may be conducted to activate the doped impurities.

Figure 16:
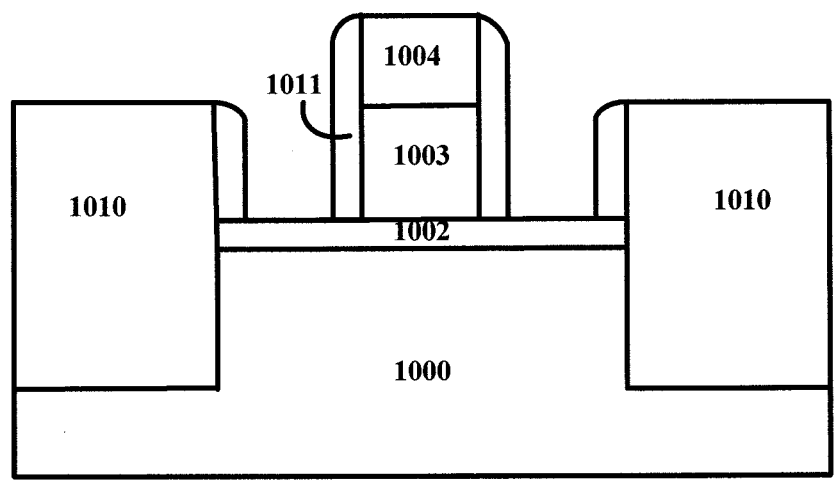
FIG. 16 is a section view showing a step of forming a spacer for the gate and spacers for the second shallow trench isolations according to an embodiment of the method for fabricating a semiconductor structure of the present invention.

Next, a nitride such as $Si_3N_4$ is deposited to a thickness of 5-150 nm, for example, 10 nm, 30 nm, 50 nm, 70 nm, 90 nm, 110 nm or 130 nm. Further, it is subjected to RIE to form nitride isolation dielectric 1011, namely, a spacer for the gate and spacers for the second shallow trench isolations. This step is shown in FIG. 16.

Figure 17:
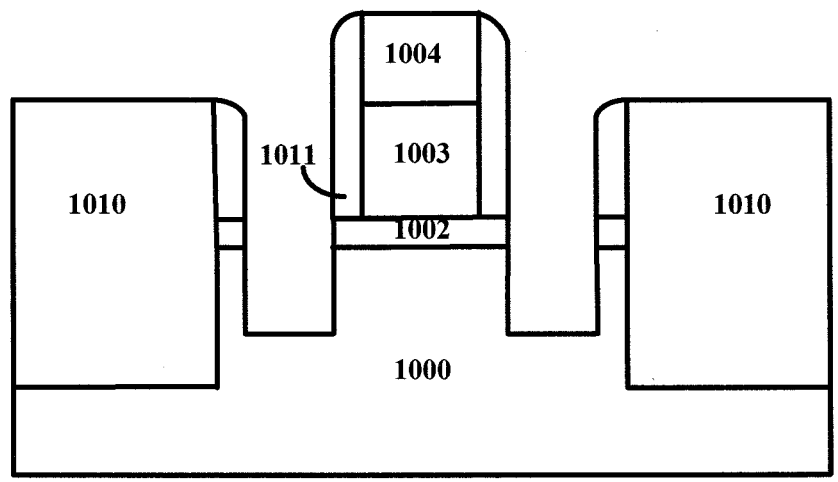
FIG. 17 is a section view showing a step of forming source and drain grooves according to an embodiment of the method for fabricating a semiconductor structure of the present invention.

FIG. 17 shows a step of forming source and drain grooves. Specifically, the gate dielectric layer 1002 and portions of the semiconductor substrate 1000 are etched within boundaries defined by the spacers 1011 for the gate and the second shallow trench isolations, so as to form grooves for the source and drain regions. In this embodiment, a Reactive Ion Etching may be adopted. The etched portions of the semiconductor substrate may have a depth of 50-150 nm, for example, 60 nm, 70 nm, 80 nm, 90 nm, 100 nm, 110 nm, 120 nm, 130 nm or 140 nm. Further, as shown in FIG. 17, due to the spacers 1011 for the second shallow trench isolations, there is a gap between the source/drain groove and second shallow trench isolation 1010, and this gap can be used to form a first seed crystal layer for forming source and drain stressors later. The first seed crystal layer may have a thickness of 5-20 nm, for example, 10 nm or 15 nm.

Figure 18:
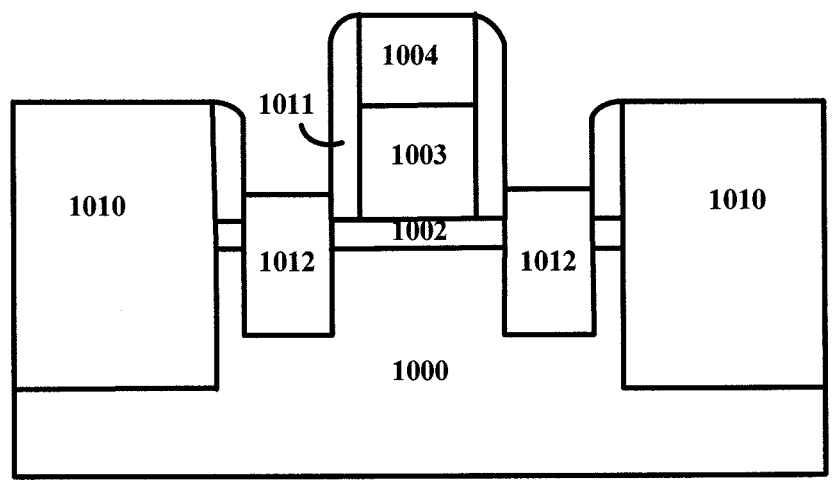
FIG. 18 is a section view showing a step of epitaxially growing stressors in the source and drain regions according to an embodiment of the method for fabricating a semiconductor structure of the present invention.

Next, source and drain stressors are epitaxially grown, as shown in FIG. 18. The stressors are formed in the grooves by selective epitaxy, so as to adjust the stress in channel and improve the device performance. Specifically, the stressors are epitaxially grown by using the above first seed crystal layers, second seed crystal layers at the bottoms of the grooves, and third seed crystal layers between the grooves and the gate as crystal seeds. For a pMOSFET, the stressors may comprise $Si_{1-x}Ge_x$ to apply a compressive stress to the channel, where the atomic percentage of Ge is in a range between 15% and 70%, for example, 30%, 40%, 50% or 60%. Preferably, if needed, B may be doped in situ while epitaxially growing $Si_{1-x}Ge_x$. For a nMOSFET, the stressors may comprise Si:C to apply a tensile stress to the channel, where the atomic percentage of C is in a rage, for example, between 0.2% and 2%. Preferable, if needed, As or P may be doped in situ into Si:C. According to the embodiment of the invention, the source and drain regions comprise the first seed crystal layers, the second seed crystal layers, the third seed crystal layers, and the stressors.

Figure 19:
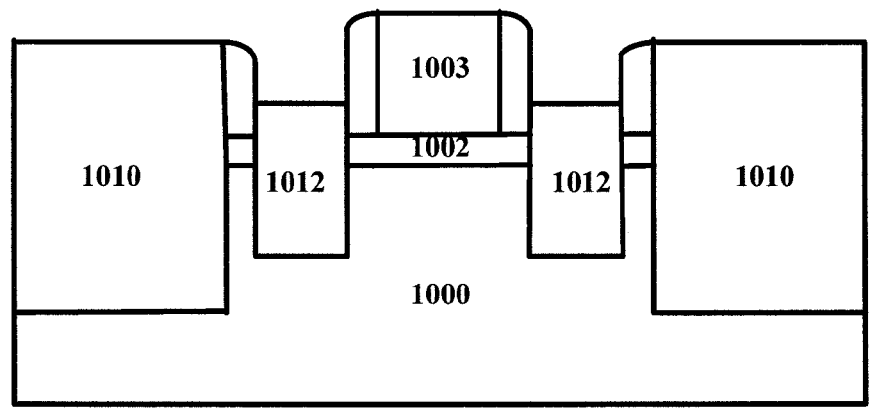
FIG. 19 is a section view showing a step of removing the nitride layer on the gate according to an embodiment of the method for fabricating a semiconductor structure of the present invention.

Then, the nitride layer 1004 is removed by RIE to expose the top of the gate, that is, to expose the first poly-silicon layer 1003, as shown in FIG. 19. Besides, the nitride layer 1004 and the nitride isolation dielectric 1011 (namely, the spacers for the gate and the second shallow trench isolations) may be concurrently removed.

Figure 20:
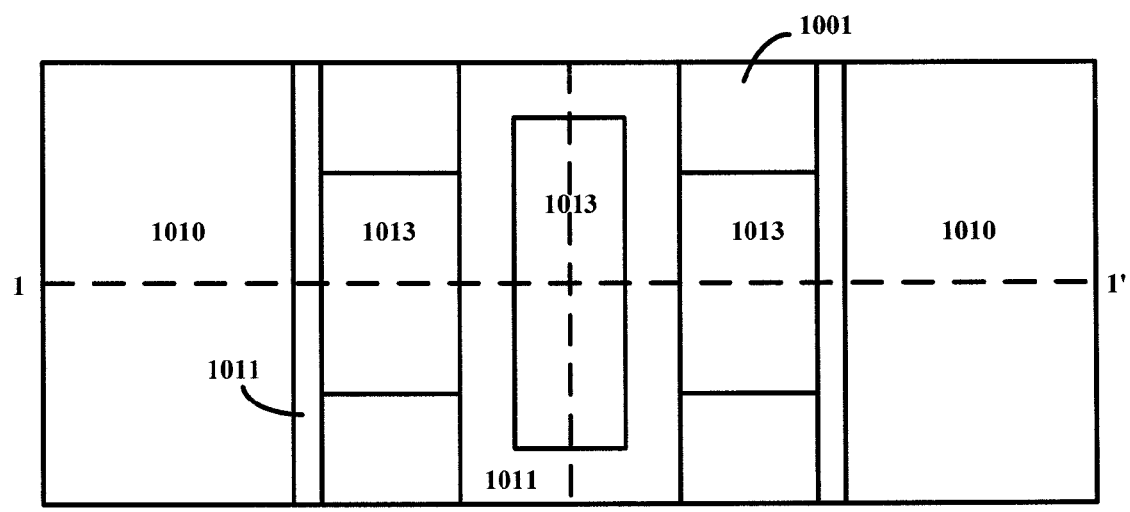
FIGS. 20 and 21, respectively, are a top view and a section view showing the semiconductor structure made according to an embodiment of the method for fabricating a semiconductor structure of the present invention.

Subsequently, metal silicides 1013 are formed, as shown in the top view in FIG. 20 and the section view in FIG. 21 along the 1-1' line of FIG. 20. The metal silicides 1013, such as NiPtSi, may be formed on the source and drain regions 1012 and the gate conductive layer (the first poly-silicon layer 1003) by a conventional method. For example, the following method may be adopted, which comprises: firstly, sputtering a thin layer of NiPt, then conducting a fast anneal at 300-500° C. to form silicides of NiPtSi, removing the unreacted metal by selective wet etching, and again conducting a fast anneal to form silicides 1013 in a low resistance state.

Figure 21:
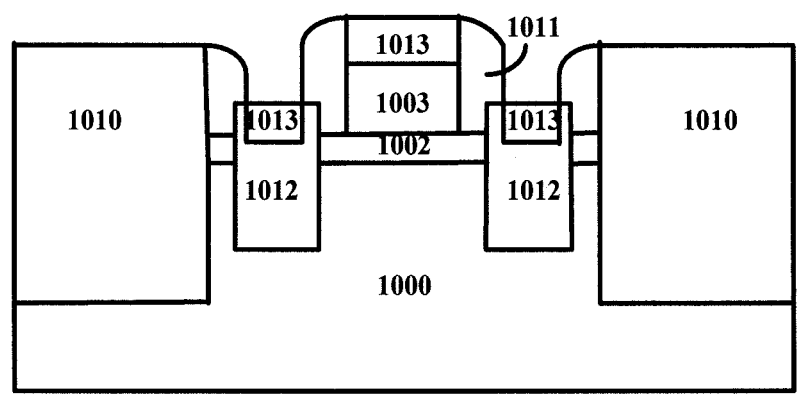

Thus, a semiconductor structure according to the embodiment of the present invention is obtained, as shown in FIG. 21. The semiconductor structure comprises: the semiconductor substrate 1000; the channel region formed in the semiconductor substrate; the gate including the dielectric layer 1002 and the conductive layer 1003 formed above the channel region; the source and drain regions 1012 disposed at opposing sides of the gate; the first shallow trench isolations 1001 embedded into the semiconductor substrate 1000 and having a length direction parallel to the gate length direction; the second shallow trench isolations 1011 formed at lateral sides of the source and drain regions 1012 and abutting the first shallow trench isolations, the source and drain regions 1012 comprising the first seed crystal layers disposed at lateral sides of the gate and abutting the second shallow trench isolations, wherein the top surfaces of the second shallow trench isolations 1011 are higher than or as high as the top surfaces of the source and drain regions 1012.

Optionally, the source and drain regions 1012 are self-aligned to the gate.

Optionally, the second shallow trench isolations 1011 are isolated from the source and drain regions 1012 respectively via the dielectric material above the first seed crystal layers.

Optionally, the dielectric material comprises $Si_3N_4$.

Optionally, the source and drain regions 1012 comprise stressors applying stress to the channel region. Specifically, for a pMOSFET, the stressors apply a compressive stress to the channel region; and for a nMOSFET, the stressors apply a tensile stress to the channel region.

Optionally, for a pMOSFET, the stressors comprise $Si_{1-x}Ge_x$, where $0<x<1$; and for a nMOSFET, the stressors comprise Si:C.

Optionally, in the $Si_{1-x}Ge_x$ material, the atomic percentage of Ge is in a range of 15%-70%; and in the Si:C material, the atomic percentage of C is in a range of 0.2%-2%.

Optionally, the filled dielectric of the second shallow trench isolations comprises $Si_3N_4$.

In the embodiments of the present invention, the top surfaces of the second shallow trench isolations 1010 are higher than or as high as the top surfaces of the source and drain regions 1012. Thus, it is possible to prevent the stress in the source and drain regions from being released outwards, resulting in an enhanced stress in the channel, increased carrier mobility, and improved device performance.

The source and drain regions are formed in a manner of self-aligning to the gate. Thus, it is possible to avoid misalignment and improve the device performance. Also, it is possible to reduce the device area and thus to reduce the manufacture cost.

Further, stressors may be formed in the source and drain regions by epitaxy to apply stress to the channel region. For example, for a pMOSFET, the source and drain regions brings a compressive stress; and for an nMOSFET, the source and drain regions brings a tensile stress. Thus, the stress in the channel region may be adjusted to further enhance the carrier mobility in the channel region.

Furthermore, the stressors, for example, $Si_{1-x}Ge_x$, are epitaxially grown by using the sidewalls of the source and drain grooves adjacent to the second shallow trench isolations as the first seed crystal layers, the bottoms of the source and drain grooves as the second seed crystal layers, and the portions of the source and drain grooves adjacent to the gate as the third seed crystal layers. Thus, it is possible to improve the crystal quality and to form a single crystal of high quality in the source and drain regions. As a result, parasitic resistances in the source and drain regions are reduced.

The dielectric of the shallow trench isolations preferably comprises nitrides to reduce the loss of the dielectric in subsequent processes.

In addition, extension regions and HALO regions may be formed for the source and drain regions to further suppress short channel effects.

In the above description, details of patterning and etching of the respective layers are not provided. It is to be understood by those skilled in the art that various means in the existing art may be utilized to form the layers and regions in desired shapes. Further, to achieve the same structure, those skilled in the art may devise methods not completely the same as those described above.

The present invention is described above with reference to the embodiments thereof. However, these embodiments are provided only for illustrative purposes, rather than limiting the present invention. The scope of the invention is defined by the attached claims as well as equivalents thereof. Those skilled in the art can make various alternations and modifications without departing from the scope of the invention, which all fall into the scope of the invention.

What is claimed is:

1. A semiconductor structure, comprising:
a semiconductor substrate;
a channel region formed in the semiconductor substrate;
a gate, which includes a dielectric layer and a conductive layer and is formed above the channel region;
source and drain regions, which are formed at opposing sides of the gate;
first shallow trench isolations, which are embedded into the semiconductor substrate and have a length direction parallel to the length direction of the gate; and
second shallow trench isolations, which abuts the outer sidewall of the source or drain region and abuts the first shallow trench isolations,
wherein the source and drain regions comprise first seed crystal layers abutting the second shallow trench isolations, and the top surfaces of the second shallow trench isolations are higher than or as high as the top surfaces of the source and drain regions.

2. The semiconductor structure according to claim 1, wherein the source and drain regions are self-aligned to the gate.

3. The semiconductor structure according to claim 1, wherein the second shallow trench isolations are isolated from the source and drain regions by a dielectric material above the first seed crystal layers.

4. The semiconductor structure according to claim 3, wherein the dielectric material comprises $Si_3N_4$.

5. The semiconductor structure according to claim 1, wherein the source and drain regions comprise stressors applying a stress to the channel region, and wherein
   for a p-type Metal Oxide Semiconductor Field Effect Transistor (pMOSFET), the stressors apply a compressive stress to the channel region; and
   for a n-type Metal Oxide Semiconductor Field Effect Transistor (nMOSFET), the stressors apply a tensile stress to the channel region.

6. The semiconductor structure according to claim 5, wherein for a pMOSFET, the stressors comprise $Si_{1-x}Ge_x$, where 0<x<1; and for a nMOSFET, the stressors comprise Si:C.

7. The semiconductor structure according to claim 6, wherein in the $Si_{1-x}Ge_x$ material, an atomic percentage of Ge is in a range of 15%-70%; and in the Si:C material, an atomic percentage of C is in a range of 0.2%-2%.

8. The semiconductor structure according to claim 1, wherein the filled dielectric of the second shallow trench isolations comprises $Si_3N_4$.

9. A method for fabricating a semiconductor structure, comprising:
   providing a semiconductor substrate;
   forming first shallow trench isolations and second shallow trench isolations;
   forming a gate including a dielectric layer and a conductive layer and having a gate length direction parallel to the length direction of the first shallow trench isolations; and
   forming source and drain regions at opposing sides of the gate, the source and drain regions comprising first seed crystal layers abutting the second shallow trench isolations,
   wherein the second shallow trench isolations are abutting the outer sidewall of the source or drain region and abutting the first shallow trench isolations, and the top surfaces of the second shallow trench isolations are higher than or as high as the top surfaces of the source and drain regions.

10. The method according to claim 9, the step of forming the source and drain regions comprises:
   etching the gate dielectric layer and the semiconductor substrate downward within boundaries defined by a spacer for the gate and spacers for the second shallow trench isolations, so as to form source and drain grooves; and
   epitaxially growing stressors by using the first seed crystal layers, the bottoms of the source and drain grooves as second seed crystal layers, and the portions of the source and drain grooves adjacent to the gate as third seed crystal layers.

11. The method according to claim 10, wherein before forming the source and drain grooves and after forming the gate, the method further comprises forming extension regions and HALO regions for the source and drain regions.

12. The method according to claim 11, wherein for a p-type Metal Oxide Semiconductor Field Effect Transistor (pMOSFET), any one or more from B, $BF_2$, and In are implanted to form the extension regions for the source and drain regions; and for a n-type Metal Oxide Semiconductor Field Effect Transistor (nMOSFET), any one or more from As and P are implanted to form the extension regions for the source and drain regions.

13. The method according to claim 11, wherein for a pMOSFET, any one or more from As and P are implanted to form the HALO regions for the source and drain regions; and
   for a nMOSFET, any one or more from B, $BF_2$, and In are implanted to form the HALO regions for the source and drain regions.

14. The method according to claim 10, wherein for a pMOSFET, the stressors apply a compressive stress to the channel region; and for a nMOSFET, the stressors apply a tensile stress to the channel region.

15. The method according to claim 14, wherein for a pMOSFET, the stressors comprise $Si_{1-x}Ge_x$, where 0<x<1; and for a nMOSFET, the stressor comprise Si:C.

16. The method according to claim 15, wherein in the $Si_{1-x}Ge_x$ material, an atomic percentage of Ge is in a range of 15%-70%; and in the Si:C material, an atomic percentage of C is in a range of 0.2%-2%.

17. The method according to claim 10, wherein the source and drain regions are doped in situ whiling epitaxially growing the stressors.

18. The method according to claim 17, wherein for a pMOSFET, B is doped in situ while epitaxially growing $Si_{1-x}Ge_x$; and for a nMOSFET, P is doped in situ while epitaxially growing Si:C.

19. The method according to claim 9, wherein the filled dielectric of the second shallow trench isolations comprise $Si_3N_4$.

\* \* \* \* \*